United States Patent [19]

Nelson et al.

[11] Patent Number: 4,758,821
[45] Date of Patent: Jul. 19, 1988

[54] METHODS AND APPARATUS FOR ANALOG-TO-DIGITAL CONVERSION

[75] Inventors: Robert G. Nelson, Dallas; Onkar S. Modgil, Mesquite, both of Tex.

[73] Assignee: Timeback Systems, Inc., Dallas, Tex.

[21] Appl. No.: 2,513

[22] Filed: Jan. 12, 1987

Related U.S. Application Data

[63] Continuation-in-part of Ser. No. 857,028, Apr. 29, 1986, Pat. No. 4,683,457, which is a continuation-in-part of Ser. No. 566,314, Dec. 28, 1983.

[51] Int. Cl.$^4$ .............................................. H02M 1/60
[52] U.S. Cl. .............................................. 340/347 AD
[58] Field of Search ................................ 340/347 AD

[56] References Cited

U.S. PATENT DOCUMENTS 3,623,072 11/1971 Pohlman et al. ............ 340/347 AD

Primary Examiner—William M. Shoop, Jr.
Assistant Examiner—Richard K. Blum
Attorney, Agent, or Firm—Kanz, Scherback & Timmons

[57] ABSTRACT

An analog-digital converter includes a source of high frequency pulses comprising a variable frequency oscillator having an output frequency f which is a function of an analog condition. Also included is a source of a reference signal, preferably pulses, having a fixed frequency whose value is a fraction of the value of the frequency of the variable frequency oscillator. The first named souce also includes a counter-divider to which the output of the variable frequency oscillator is applied. The counter-divider has an output which is either f/N or f/N−M where N and M are whole integers and M is less than N. A phase comparator is responsive to the reference signal and to the output from the counter-divider for measuring the phase difference between the reference signal and the output pulses from the counter-divider. The dividing ratio of the counter-divider is under control of means responsive to the measure of phase difference such that the counter-divider is adjusted to bring the pulses from the counter-divider toward an in-phase relationship with the reference signal as seen at the phase comparator. The selection of the dividing ratio is carried out by a logic means which responds to the output of the variable frequency oscillator and the output of the source of the reference signal to provide for a selection of the counter-divider division ratio for each cycle of the reference signal. The output or measure of phase difference is in the form of a single-bit digital function and this function is applied to a digital low-pass filter to produce a binary word.

15 Claims, 3 Drawing Sheets

METHODS AND APPARATUS FOR ANALOG-TO-DIGITAL CONVERSION

RELATED APPLICATIONS

This application is a continuation-in-part of application Ser. No. 857,028 now U.S. Pat. No. 4,683,457, filed Apr. 29, 1986 which in turn is a continuation-in-part of application Ser. No. 566,314, filed Dec. 28, 1983.

FIELD OF THE INVENTION

This invention relates to analog-to-digital conversion and more particularly to an analog-digital converter wherein two sources of high frequency time-spaced pulses are utilized. One of the sources includes an oscillator having a fixed frequency output and the other source includes an oscillator having a variable frequency output, the variable frequency output being a function of an analog condition.

BACKGROUND OF THE INVENTION

Conditions which can be measured (e.g. temperature, voltage, pressure, weight, distance, velocity, capacitance, etc.) are often digitized so that the measure can be expressed as discrete steps or digits. The first step in digitizing often includes the use of a transducer, a device that will convert energy from one form to another. For example, a piezoelectric crystal can be used to convert pressure variations into an analog voltage and the thermistor can be used to generate an analog voltage as a function of temperature. These voltages can then be digitized by an analog-to-digital convertor. Other transducers, however, can more directly generate a digital output. For example, an interferometer can convert a displacement into a changing optical interference pattern that can be converted into a pulsing, enhanced digital, voltage via a photocell.

A popular form of analog-to-digital converter utilizes a ladder of matched resistors to divide either the input voltage or a reference voltage into a series of levels and arrive at digitized or quantized representations of that voltage. When used in these devices, feedback is in the form of voltage.

Voltage-to-frequency converters have a frequency output which is continuously variable. To be more useful this output can be counted by a binary counter gated by a fixed clock or the output can be used to gate a fixed clock being used to drive a counter. Voltage-to-time converters such as integrators, can be used in a similar manner as a sustitute for the voltage-to-frequency converters. Another form of converter is the delta-modulator which generates a single weighed digital pulse train with the plurality of the pulses dependent upon a difference signal. This difference signal is created by subtracting the input voltage from the feedback voltage. The feedback voltage is generated by either a charge dispensing circuit or a digital-to-analog convertor.

Another related technique is described in U.S. Pat. No. 4,300,135 which discloses a system wherein an analog condition causes a change in the capacitor of a variable frequency oscillator (VFO). This analog condition changes the frequency of the VFO output which is applied to a phase-locked loop (PLL). The PLL discriminator has an error voltage output the magnitude of which is indicative of the frequency deviation of the oscillator, and therefore, indicative of the analog condition. This error voltage is analog and is not encoded except for detection of a voltage in excess of a set threshold.

U.S. Pat. No. 3,140,612 describes a system wherein a variable such as acceleration causes a displacement between a case and a mass suspended in that case. This displacement causes a change in the time lag between two ultrasonic signals used to measure the position of the mass. The output is a pulse whose width is a function of the position of the mass within the case and is therefore a function of an initial variable such as acceleration.

U.S. Pat. No. 3,294,958 describes a system wherein an analog voltage causes a change in the frequency of a voltage control oscillator (VCO). The VCO output is compared to a reference oscillator to generate two measures of the frequency differences between the oscillators. The first measure is fed back to linearize the VCO response to the analog voltage and the second measure is a difference frequency which is counted to provide a digital output representative of the analog voltage.

In U.S. Pat. No. 3,868,677 there is described a system wherein an analog voltage causes a change in the phase of a voltage control oscillator (VCO). The VCO output is compared to a referance oscillator with a phase detector. The phase detector output is a signal whose pulse width is a function of the analog voltage. The phase detector output gates a counter clocked by a reference oscillator. The phase detector output is also fed back negatively to form a phase-locked loop.

A form of analog-to-digital converter which represents a significant improvement over the analog-to-digital converters above described is disclosed in co-pending application filed by Robert G. Nelson on Dec. 28, 1983 bearing Ser. No. 566,314 and entitled "Methods and Apparatus for Analog-To-Digital Conversion" of which the present application is a continuation-inpart. The method described therein comprises the steps of generating two high frequency signals which are harmonically related and modifying the phase of one of the signals in response to an analog function. The phase of the signals is compared to determine the phase difference and an action taken to return the signals toward an in-phase state. A measure of the action taken is utilized as a measure of the instantaneous value of the analog function.

In one specific embodiment of an analog-to-digital converter described in the above mentioned application two high frequency oscillators are employed having digital outputs with the frequencies of the oscillators bearing a harmonic relationship one to the other. A representation of an analog condition is applied to cause a shift in phase in at least one of the digital signals. A comparator is then utilized to obtain a measure of the phase-shift and the measure of the phase-shift is employed to adjust the phase of the phase-shifted signal toward an in-phase condition. The measure of phase-shift results in the generation of a digital function representative of the amplitude of the adjustment utilized to return the phase-shifted signal towards an in-phase condition. The digital function is applied to a low-pass digital filter to produce a binary word representative of the instantaneous value of the analog condition. A preferred form of digital function is a single weighed digital function.

Yet another analog-to-digital converter is set forth in co-pending application of Robert G. Nelson and James D. Awtrey bearing Ser. No. 857,028, filed Apr. 29, 1986 and entitled "Analog-To-Digital Convertor" of which the present application is a continuation-in-part. That application describes an ana log-to-digital converter which includes a signal source having a fixed frequency output. Means including an oscillator comprised of a plurality of digital gates connected serially in a loop, has an output of pulses, harmonically related to the pulses from the source. At least one of the digital gates incudes impedance means responsive to an analog condition to form a modulator. Change in the value of the impedance changes the time constant in the modulator to effect a change in the pulses related to the instantaneous amplitude of the analog condition. The outputs of the source and of the means are applied to a comparator. Means responsive to the comparator are employed to correct the means pulses toward an in-phase state relative to the pulses of the source. A digital function is produced whose value is proportional to the correction made to the means pulses and is thus representative of the instantaneous value of the analog condition.

BRIEF SUMMARY OF THE INVENTION

In the present invention a representation of an analog condition is applied to cause a shift in phase in one of two signals. The signals are then compared to obtain a measure of the phase-shift which measure is utilized to adjust the phase of the phase-shifted signal toward an in-phase condition. As a result of the measure of phase-shift, there is generated a digital function which is representative of the amplitude of the analog condition and of the adjustment utilized to return the phase-shifted signal toward an in-phase condition.

In carrying out the generally described method there is provided a means to encode a representation of an analog condition where that representation causes a phase-shift inversely proportional to the analog condition. In such a case the analog condition is proportional to the frequency of the unadjusted phase-shifted signal. Hence, when the adjustments are made to return the two signals into an in-phase condition the adjustment will be proportional to the instantaneous amplitude of the analog condition.

In carrying out this invention in one illustrative embodiment thereof, the analog-to-digital converter includes a source of high frequency pulses comprising a variable frequency oscillator having an output frequency f which is a function of an analog condition. Also provided is a reference signal source having a fixed frequency whose value is a fraction of the value of the frequency of the variable frequency oscillator. The first named source also includes a counter-divider to which the output of the variable frequency oscillator is applied. The counter-divider has an output which is either f/N or f/N−M where N and M are whole integers and M is less than N. A phase comparator is responsive to the reference signal and to the output from the counter-divider for measuring the phase difference between the reference signal and the output of the counter-divider. The dividing ratio of the counter-divider is under control of a means responsive to the measure of phase difference such that the counter-divider is adjusted to bring the pulses toward an in-phase relationship with the reference signal as seen at the phase comparator. More specifically, the selection of the dividing ratio is carried out by a logic means which responds to the output of the variable frequency oscillator and the source of reference signal to provide for the selection of the counter-divider division ratio for each cycle of the reference signal.

The output or measure of phase difference in the illustrative embodiment is in the form of a single-weighed digital function and this function is applied to a digital low pass filter to produce a binary word.

The variable frequency oscillator may be in the form of a voltage controlled oscillator wherein the converter responds to an analog condition represented by a voltage to produce a variable frequency whose value is proportional to the value of the analog condition. On the other hand the variable frequency source may be a variable frequency oscillator including a transducer responsive to a physical condition, such as vibration or acceleration, to cause a change in the output frequency of the oscillator as a function of the amplitude of the vibration or the acceleration.

BRIEF DESCRIPTION OF THE DRAWINGS

The invention, with further features, aspects and advantages thereof will be better understood from a consideration of the following detailed description in conjunction with the accompanying drawings showing the best mode currently known to the present inventors for the practice of the present invention.

DETAILED DESCRIPTION OF THE INVENTION

Figure 1:
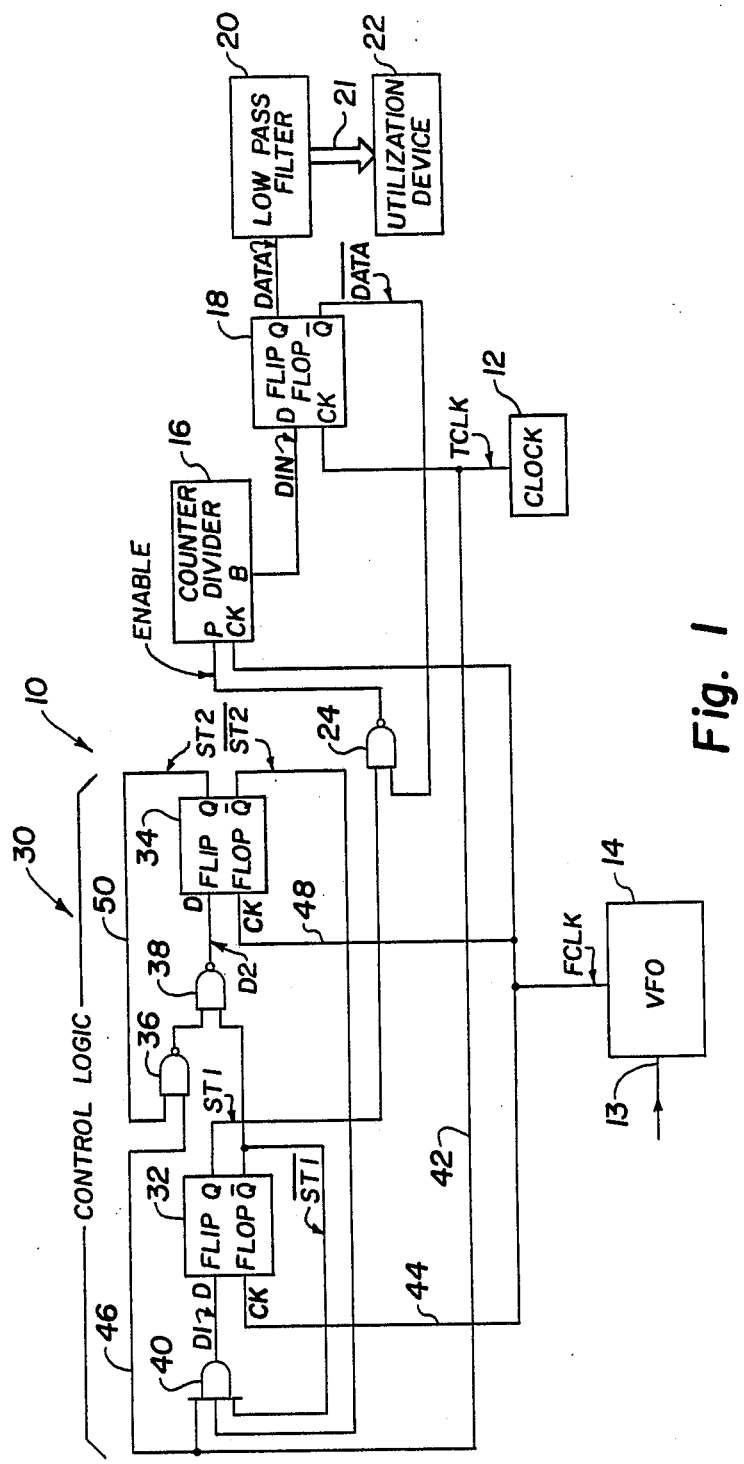
FIG. 1 is a schematic representation of the analog-to-digital converter of the present invention.

In the description which follows like elements will be designated with the same reference characters throughout the various FIGURES. The method of the present invention includes the step of generating two high frequency signals, causing a shift in the phase of one of the two signals in response to an analog condition, comparing the phase of the signals and adjusting the phase of the phase-shifted signal towards an in-phase condition. More specifically, one of the signals is at a fixed frequency as may be produced by a clock. The other signal is also essentially of a fixed frequency and is produced by dividing the output of a variable frequency oscillator, whose frequency is a function of an analog condition, by a ratio determined by the phase relationship of the two fixed frequency signals. The division ratio will either be N or N−M, where N and M are whole integers and M is less than N. A comparison of the phase relationship between the signals gives rise to a measure of phase difference and the measure of phase difference is utilized to select the division ratio to bring the signals toward an in-phase relationship. The output or measure of phase difference is in the form of a single-bit digital function and this function is filtered to produce a binary word representative of the instantaneous value of the analog condition.

Referring now to FIG. 1 the analog-to-digital converter 10 of the present invention is shown to include two sources of high frequency signals. The first of the sources includes a clock 12 that has a constant frequency output. The second source is comprised of a variable frequency oscillator 14 and a counter-divider 16. In accordance with the present invention, whereas the variable frequency oscillator 14 has an output whose frequency varies as a function of applied analog condition, the counter-divider 16 has a frequency output that is constant and harmonically related to the frequency of the clock 12. In the preferred embodiment the frequencies at the outputs of the counter-divider 16 and the clock 12 are equal.

The counter-divider 16 has an output DIN and the clock 12 has an output TCLK. Both outputs are applied to a phase-comparator 18, a D flip-flop, which produces an output DATA whose character is dependent upon whether or not the transition of the output DIN of the counter-divider 16 leads or lags the transition of the output TCLK from the clock 12. The selected transitions may be either positive or negative going. In the present specific embodiment there is utilized the negative-going transition of the output DIN from counter-divider 16 and the positive-going transition of the output TCLK from clock 12.

The output DATA from the comparator 18, a single-bit digital function, will either be a logic level 0 if the negative transition of the output of the counter-divider 16 leads the onset of the output from the clock 12 or a logic level 1 if the negative transition of the output of the counter-divider 16 lags the onset from the clock 12. This single-bit digital function is applied to a low-pass digital filter 20 which produces at its output a binary word. The binary word is then applied to a selected utilization device 22 which, for example, may be a recorder.

Figure 4:
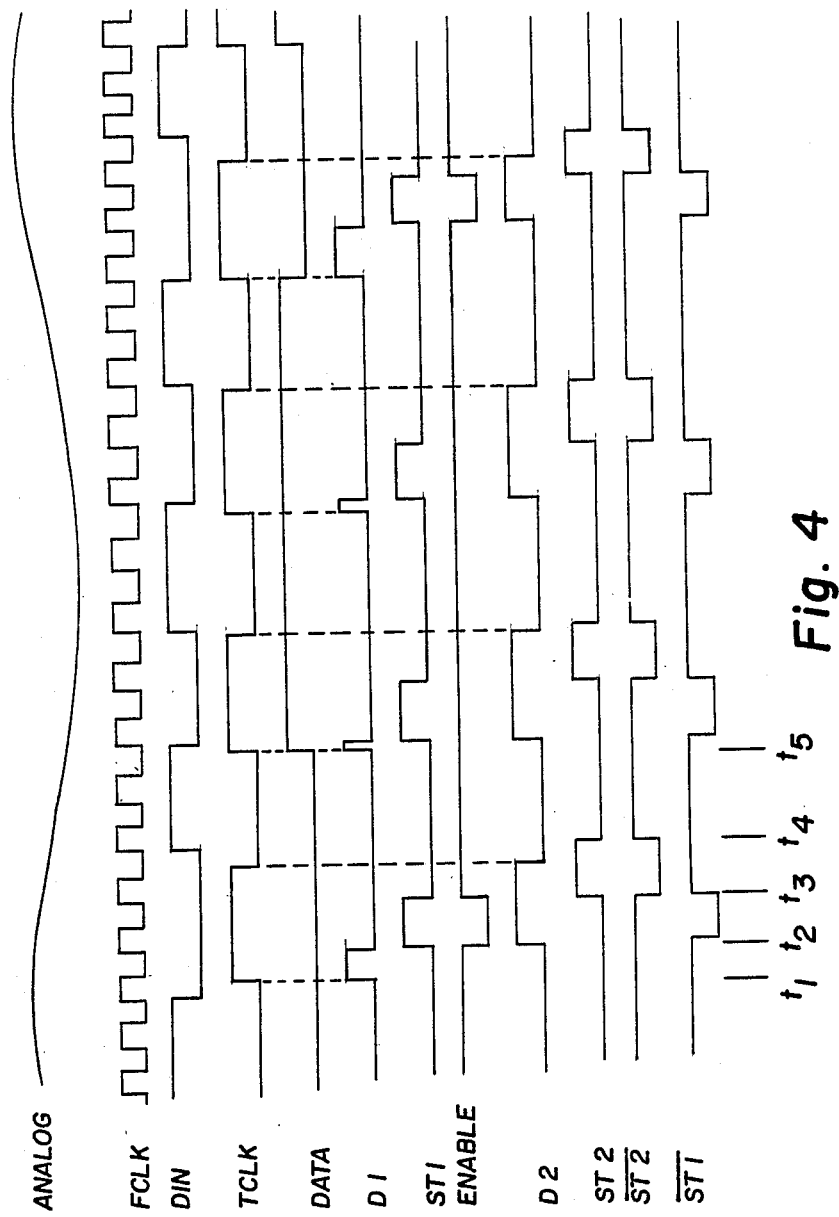
FIG. 4 is a plot of waveform versus time useful in the understanding of the present invention.

The counter-divider 16 is controlled such that it either divides by a value N or by a smaller value N−M. These values or dividing ratios N and N−M are selected on the basis of a criterion of whether the negative transition of the output of the counter-divider 16 occurs early or late with respect to the positive going transition from clock 12. If the negative transition of the output DIN (FIG. 4) of the counter-divider 16 occurs early with respect to the positive transition of the clock 12 output TCLK the inverted output $\overline{\text{DATA}}$ of the comparator 18, a D flip-flop, is fed back via NAND gate 24 to the P input of the counter-divider 16 to cause the counter-divider to divide by N. On the other hand if the negative transition of the output DIN of the counter-divider 16 occurs late with respect to the positive transition of output TCLK of the clock 12 (FIG. 4) the inverted output $\overline{\text{DATA}}$ of the comparator 18 is fed back to the P input of the counter-divider 16 via the NAND gate 24 to cause the counter-divider 16 to divide by N−M. If the value of the analog condition is such that the output FCLK from the variable frequency oscillator 14 is at a higher frequency then the counter-divider 16 will count faster, the counter-divider's 16 output DIN will occur early more often with respect to the output TCLK of the clock 12 and the inverted output $\overline{\text{DATA}}$ from comparator 18 will cause the counter-divider 16 to divide by N more often. On the other hand, if the value of the analog condition is such as to cause the variable frequency oscillator (VFO) 14 to output FCLK at a lower frequency the counter-divider 16 will count slower, the negative transition of the output DIN of the counter-divider 16 will be late more often and the inverted output $\overline{\text{DATA}}$ of the comparator 18 will cause the counter-divider 16 to divide by N−M more often. Accordingly, the phase of the negative transition of the output DIN of the counter-divider 16 with respect to the clock 12 output TCLK is controlled by the frequency of the variable frequency oscillator 14. The phase is measured with the phase comparator 18 and the negative transition of the output DIN of the counter-divider 16 is brought towards an in-phase relationship to TCLK by adjusting the dividing ratio of the counter-divider 16.

Control logic 30 including the NAND gate 24 assures that the dividing ratio of counter-divider 16 may be changed but once for every TCLK and in conjunction with TCLK. TCLK controls the comparator 18 such that but a single binary value is produced for each TCLK pulse. This single binary value is processed by the decimating digital low-pass filter 20 in which binary ones and zeros are multiplied with the finite impulse response filter coefficients to provide the binary word at a lower sample rate applied to utilization device 22 via bus 21. Digital low-pass filters are described in "Digital Filters" by R. W. Hamming, 2nd Edition published by Prentice Hall, 1983.

The control logic 30 includes two D flip-flops 32 and 34, three NAND gates 36, 38 and 24 and one AND gate 40. The control logic 30 has three logic states, logic state zero, logic state one represented by signal logic ST1 at logic level 1, and logic state two represented by signal ST2 at logic level 1. State zero occurs in the absence of logic states one and two. At this point it would be helpful to refer also to FIG. 4 the waveform time diagram to understand that logic state one is entered when TCLK goes to logic level 1 and upon the next positive transition of FCLK. More specifically, there are three inputs to the AND gate 40. These inputs are TCLK from the clock 12 applied by way of conductor 42, $\overline{\text{ST1}}$ and $\overline{\text{ST2}}$. With all three inputs at logic level 1 at time $t_1$ there appears at the output of AND gate 40 a positive going pulse D1 applied to the D input of the flip-flop 32. With the next positive going transition of FCLK at time $t_2$ the pulse ST1 representative of logic state one is generated and latched up for one cycle of FCLK; in other words the logic state one exists but for one cycle of FCLK. It is during this period that the logic level 1 of signal ST1 is applied to NAND gate 24. In this same period the output DATA of the comparator 18 is at a logic level 0 and $\overline{\text{DATA}}$ is at a logic level 1 as would occur when the negative going edge of the output DIN of counter-divider 16 occurs early with respect to the positive transition of TCLK. The $\overline{\text{DATA}}$ signal is applied to the other input of the NAND gate 24 whose output ENABLE will be at a logic level 0. ENABLE at the logic level 0 is applied to the P input of the counter-divider 16. The application of logic level 0 to the P input of the counter-divider 16 disables the counter-divider for one FCLK cycle and effectively selects the division ratio for the counter-divider 16 at N−M.

In the present embodiment M=1, or one cycle of FCLK. The value of M is determined by the time duration of the pulse ST1 at logic level 1. M can be assigned other integer values by modifying central logic 30 so that ST1 at logic level 1 will exist for more cycles of FCLK. For example if a value of 2 is assigned to M, then ST1 would exist for two cycles of FCLK.

Upon the next transition of FCLK the control logic enters into state two as represented by the onset of the pulse $\overline{ST2}$ at time $t_3$. $\overline{ST1}$, at logic level 0, is applied at time $t_2$ to an input of the NAND gate 38. At the same time ST1 is also applied back to the input of the AND gate 40 which causes the value of the pulse D1 to be at logic level 0, and therefore, when the next transition of FCLK occurs, at time $t_3$ the control logic 30 enters state two as represented by the generation of the pulse ST2. The control logic 30 remains in state two until the next transition of FCLK after TCLK goes to logic level 0 at which time the control logic 30 returns to state zero.

The flip-flop 34 remains in logic state two so long as TCLK is at logic level 1. This avoids an early return to state one which would cause a premature clocking out of the output of the counter-divider 16 and could result in multiple binary values being generated during a given cycle of TCLK. By holding the logic in state two until TCLK goes to logic level 0, it is assured that there will be but one binary value produced at the output of the comparator 18 for each cycle of TCLK.

The transition of states from zero through two takes place in the control logic 30 in the following manner. Prior to time $t_1$, the control logic 30 is in state zero since TCLK is a logic level 0. At time $t_1$, TCLK, $\overline{ST1}$ and $\overline{ST2}$ are at logic level 1 and the AND gate passes pulse D1 and upon the next positive transition of FCLK, applied to a CK input of flip-flop 32 via conductor 44, $\overline{ST1}$ goes to logic level 1. Concomitantly ST1 goes to logic level 0 and terminates pulse D1.

TCLK is also applied at a logic level 1, via conductor 46, to an input of NAND gate 36. Prior to time $t_3$ $\overline{ST2}$ is at logic level 0 and this logic level 0 is applied via conductor 50 to the other input of the NAND gate 36 resulting in a logic level 1 appearing at the output of NAND gate 36 which is applied to an input of NAND gate 38. At this time $\overline{ST1}$, applied to the other input of gate 38 is at a logic level 0 and therefore the output of gate 38 is a logic level 1, resulting in a positive transition of pulse D2. Now upon the next positive transition of FCLK, applied to the CK input of flip-flop 34 via conductor 48, ST2 appears as a logic level 1 at the Q output of flip-flop 34. ST2 or state two is latched until the next positive transition of FCLK immediately following the value of TCLK falling to a logic level 0 value as at time $t_4$. At this time in the absence of ST1 and ST2 the control logic 30 has returned to state zero and it remains there until the next positive transition of TCLK at time $t_5$.

The output ENABLE from the control logic 30 appearing at the output of NAND gate 24 is normally at logic level 1 such that the counter-divider 16 is enabled or allowed to increment on every positive transition of FCLK. The character of ENABLE whether logic level 0 or a logic level 1 is controlled by $\overline{DATA}$ each time ST1 goes to a logic level 1. The ENABLE output will change the counter-divider 16 from a divide-by-N-M to a divide-by-N. In one embodiment of the present invention N=5 and M=1 and therefore N−M=4. The counter-divider 16 is a two-bit binary counter. When the counter-divider's output DIN has its negative transition early with regard to TCLK as shown prior to time $t_1$, the output $\overline{DATA}$ of the phase comparator 18 goes to a logic level 1 and ENABLE goes to a logic level 0 upon the next occurrence of logic level 1 ST1, as at time $t_2$, causing the counter-divider 16 not to increment on the next positive going transition of FCLK. Since the counter-divider 16 normally functions as a divide by 4 counter-divider the loss of one increment that occurs when ENABLE goes to a logic level 0 for one cycle of FCLK causes the output DIN from the counter-divider 16 to occur at 1/5th the rate of FCLK. Thus ENABLE changes the counter from dividing FCLK by 4 to dividing FCLK by 5. Since an additional cycle of FCLK is needed before the next negative going transition of DIN, DIN has been delayed with respect to TCLK and brought towards an in-phase condition.

On the other hand, when the output DIN of counter-divider 16 has its negative going transition late with respect to TCLK, as at time $t_5$, the output $\overline{DATA}$ of the phase comparator 18 goes to a logic level 0 and ENABLE remains at a logic level 1 during the next occurrence of logic level 1 of ST1 allowing the counter-divider 16 to increment on every positive going transition of FCLK. The counter-divider 16 divides FCLK by 4 and causes the next negative going transition of DIN to occur without delay. Thus if FCLK is within the frequency limits, that is within 4 to 5 times the frequency of TCLK, the output DIN of the counter-divider 16 will be brought towards an in-phase condition with respect to TCLK.

The process continues with either a divide-by-4 or a divide-by-5 as selected by the control logic 30 and $\overline{DATA}$, in order that the output DIN of the counter-divider 16 remains in-phase with TCLK. The process gives rise to the generation of the single-bit digital function DATA.

Each single digital bit is indicative of the direction of phase error. The single digital bits may either be single weighed digital functions or multi weighed digital functions. In the present embodiment the digital bits are single weighed digital functions.

The variable frequency oscillator 14 (VFO) can be any device that has an output within a desired frequency range and whose frequency can be altered by a selected variable such as capacitance, voltage, temperature and resistance. One form of variable frequency oscillator is shown in FIG. 1 as a voltage controlled oscillator responsive to an analog voltage applied to its input 13. The voltage control oscillator, otherwise known as a voltage-to-frequency converter, is available from several manufacturers.

In one embodiment of the invention the oscillator 14 has a center frequency of 1.125 megahertz and varies from between 1 megahertz to 1.25 megahertz. In that embodiment the clock 12 produced a 250 kilohertz square wave.

Various elements comprising the system of FIG. 1 are available from Texas Instruments Incorporated and are identified by the following codes: AND gate 40 is an SN 74HC11N; flip-flops 32 and 34 and comparator 18 are SN 74HC74N; the NAND gates 36, 38 and 24 are SN 74HC00N; and counter-divider 16 is SN 74HC161N.

Figure 2:
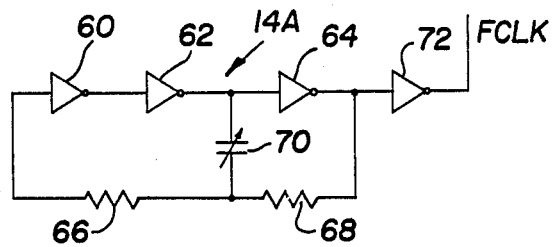
FIG. 2 is a schematic representation of a ring oscillator suitable for use in the present invention wherein the frequency of the oscillator is under control of a variable capacitor.

A preferred type of variable frequency oscillator as shown in FIG. 2 is a ring oscillator comprised of an odd number of digital inverters gates 60, 62 and 64, resistors 66 and 68 and a variable capacitor 70. Inverter 72 serves as a buffer-driver.

The odd number of inversions in the ring oscillator results in an unstable state in which a voltage transition from high state to low state will propagate around the loop until it reaches the next inverter, then propagate as a transition from low state to high state. These transitioning edges, high to low or low to high, will continuously propagate around the loop of the oscillator 14A.

The capacitor 70 and the resistor 66 and 68 serve as time delay networks. The capacitor 70 is responsive to an analog condition which causes the delay network to be modulated by the analog condition. This results in a modulation to the time it takes for the voltage transition or edge to propagate from one digital gate to the next. As a result the analog condition causes a change in frequency with which the voltage transition circulates around the loop. The capacitor 70 may be subjected to an analog condition such as vibration or acceleration. In the case of vibration, the capacitor, as will later be described, may be in the form to be sensitive to earth vibrations and the ring oscillator 14A, in conjunction with the other components of the analog-to-digital converter of FIG. 1 would provide a direct digital geophone. One form of capacitor useful in detecting vibrations is illustrated in FIG. 2 of co-pending application Ser. No. 857,028 of which this application is a continuation-in-part and which FIG. 5 and related description is incorporated herein by reference.

Figure 3:
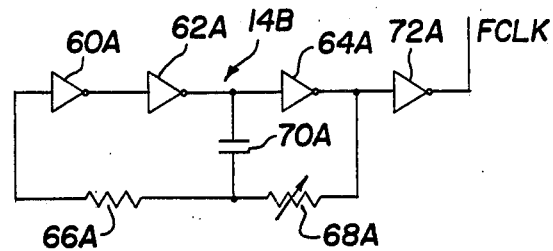
FIG. 3 is another representation of a ring oscillator suitable for use in the practice of the present invention wherein the frequency of the oscillator is under control of a variable resistor.
Figure 5:
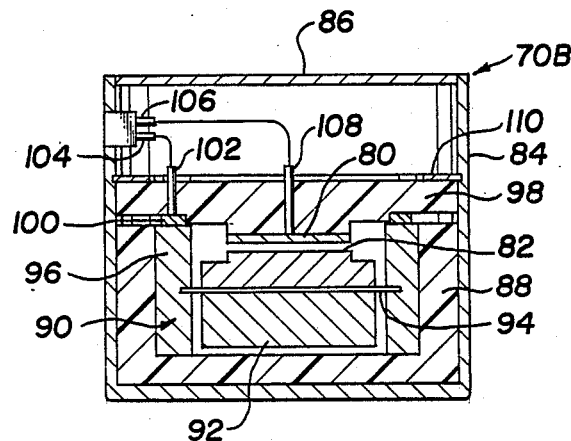
FIG. 5 is a cross section of a capacitor useful in the oscillator in FIG. 2 and preferred in that the variation in spacing between the capacitor plates responsive to vibration or acceleration is linear with respect to the output frequency of the oscillator.

FIG. 3 illustrates another ring oscillator 14B comprised of inverters 60A, 62A, 64A, fixed capacitor 70A, fixed resistor 66A and variable resistor 68A. As in the embodiment of FIG. 2 inverter 72A serves as a buffer. The oscillator of FIG. 3 operates in the same manner as that of FIG. 2 except that the time constant of the oscillator is varied in FIG. 3 by varying the value of the resistor 68A. The variable resistor 68A can also be of the type whose value varies as a function of acceleration or vibration. One specific form of variable resistor having such characteristics is illustrated in FIG. 5 and further described in co-pending application Ser. No. 857,028 referred to above. On the other hand, the resistor may be the type subject to temperature, a thermistor, and cause the output frequency of the oscillator 14B to vary as a function of temperature.

Inverters suitable for use in the oscillators of FIGS. 2 and 3 are available from Texas Instruments and may be either of the 74HCU04 or 74HC4049 type. In the embodiment of FIG. 2 variable capacitor 70 had a nominal value of 100 pico farads, resistor 66 had a value of 15K ohms and resistor 68 had a value of 1.8K ohms.

A preferred form of variable capacitor useful in the embodiment of FIG. 2 is shown in FIG. 5. The variable capacitor 70B is comprised of opposing plates spaced one from the other and in which the spacing is varied as a function of acceleration or vibration to give rise to a change in capacitance and therefore a change in the frequency of the oscillator 14A. The embodiment of FIG. 5 is preferred in that the variation in capacitance caused by variation in the spacing between the capacitive elements is linear or causes a linear change in the frequency of the oscillator 14A and therefore the frequency of the oscillator is linear with respect to the vibration or acceleration giving rise to the change in spacing between the capacitive elements.

The variable capacitor 70B may also be referred to as a capacitive geophone or a capacitive accelerometer. The capacitor 70B is comprised of a cylindrical metallic housing 84 having a cover plate 86. Within the housing 84 is mounted an insulating, cupshaped member 88 which insulates the metallic inertial assembly 90 from the housing 84. The inertial assembly is comprised of an inertial mass 92 the upper surface of which 82 serves as one plate of the capacitor. The inertial mass 92 is secured to a spring 94 of the spider type having its free ends secured to a metallic cylinder 96 closely fitted within the cupshaped insulator 88. The upper capacitive plate 80 is mounted to an insulating disc 98 and metallic ring 100 is an electrical contact with the metallic cylinder 96 and by way of the spring 94 to the capacitive plate 82. One side of the capacitor, side 82, is connected by way of the metallic ring 100 and contact 102 to a terminal 104 mounted in a side wall of the housing 84. The other side 80 of the capacitor is electrically connected to a terminal 106 by way of contact 108 mounted in the insulator 98 and in electrical contact with the capacitive plate element 80. The entire assembly is locked in position within the housing 84 by way of retaining ring 110.

Now that the invention has been described, variations and modifications will become apparent to those skilled in the art. It is intended that such modifications and variations be encompassed within the scope of the appended claims.

What is claimed is:

1. An analog-to-digital converter comprising:
   (a) a source of high frequency pulses comprised of a variable frequency oscillator having an output frequency f which is a function of an analog condition, and a counter-divider having an output which is either f/N or f/N−M where N and M are whole integers and M<N,
   (b) a second source for producing a reference signal having a fixed frequency whose value is a fraction of the value of the frequency of said variable frequency oscillator,
   (c) means for applying the output of said variable frequency oscillator to said counter divider,
   (d) a phase comparator responsive to said reference signal and said output from said counter-divider for measuring the phase difference between said reference signal and said output of said counter-divider, said reference signal and said pulses from said counter-divider being harmonically related,
   (e) means responsive to said measure of phase difference to select the dividing ratio of said counter-divider such that the frequency of pulses from said counter-divider is adjusted to bring said pulses toward an in-phase relationship with the said reference signal as seen at said phase comparator, and
   (f) means responsive to said measure of phase difference to produce a digital function whose value is proportional to the adjustment made to bring said pulses toward an in-phase relationship with said reference pulses.

2. The analog-digital converter of claim 1 in which each said measure of phase difference comprises a single-bit digital function.

3. The analog-to-digital converter of claims 1 or 2 wherein said digital function is applied to a digital low-pass filter responsive to said function for producing a binary word.

4. The analog-to-digital converter of claims 1 or 2 including logic means responsive to said output of said variable frequency oscillator and said reference signal to provide for said selection of said counter-divider's division ratio for each cycle of the reference signal.

5. The analog-to-digital converter of claims 1, 2 or 3 including logic means responsive to said output of said variable frequency oscillator and said reference signal to limit the selection of said counter-divider dividing ratio to one per cycle of said reference signal.

6. The analog-to-digital converter of claims 1 or 2 in which said variable frequency oscillator includes a variable capacitor responsive to said analog condition.

7. The analog-to-digital converter of claim 6 in which said analog condition is acceleration.

8. The analog-to-digital converter of claim 6 in which said variable frequency oscillator is a ring oscillator having a frequency higher than the frequency of said reference signal.

9. The analog-to-digital converter of claim 5 in which said logic means comprises an AND gate, first and second comparators, said first comparator having an ST1 output and an $\overline{ST1}$ output, said second comparator having an $\overline{ST2}$ output and $\overline{ST2}$ output, means for applying said reference signal and said $\overline{ST1}$ and $\overline{ST2}$ outputs to said AND gate, said AND gate having an output signal when a reference signal and said $\overline{ST1}$ and $\overline{ST2}$ outputs are concurrently high, said first comparator responsive to said output signal and a positive transition of said output frequency f to produce a high value for the ST1 output, said means responsive to said measure of phase difference including a NAND gate, and means for applying said ST1 output and said measure of phase difference to said NAND gate.

10. A method of analog-to-digital conversion comprising the steps of:
   (a) generating a high-frequency signal whose frequency is a function of an analog condition;
   (b) dividing said signal by selected integers to produce a family of pulses having a fixed frequency of lower value;
   (c) generating a reference signal having a fixed frequency and bearing a harmonic relationship to said family of pulses;
   (d) comparing the phase of said family of pulses and said reference signal to determine phase difference;
   (e) selecting the integer by which to divide said variable frequency pulses to bring said family of pulses and said reference signal toward an in-phase state, and
   (f) utilizing a selection criterion to generate a digital function for each cycle of said reference signal.

11. The method of claim 10 wherein the said family of pulses is derived either by a dividing ratio of N or a dividing ratio of N−M where N and M are integers and M is less than N.

12. The method of claim 11 wherein N is equal to 5 and M is equal to 1.

13. The method of claim 11 wherein the dividing ratio of N is selected when said family of pulses lead said reference signal and the dividing ratio of N−M is selected when said family of pulses lag said reference signal.

14. The method of claim 10 wherein said generated digital function is a single bit digital function.

15. The methods of claims 10 or 14 wherein said digital function is applied to a digital low-pass filter to produce a binary word.

* * * * *

UNITED STATES PATENT AND TRADEMARK OFFICE
CERTIFICATE OF CORRECTION

PATENT NO. : 4,758,821

DATED : July 19, 1988

INVENTOR(S) : Robert G. Nelson et al

It is certified that error appears in the above-identified patent and that said Letters Patent is hereby corrected as shown below:

IN THE SPECIFICATION

Column 7, line 3, change "$\overline{ST2}$" to -- ST2 --.

Column 7, line 5, change "ST1" to -- $\overline{ST1}$ --.

Column 7, line 29, change "$\overline{ST1}$" to -- ST1 --.

Column 7, line 29, change "ST1" to -- $\overline{ST1}$ --.

Column 7, line 32, change "$\overline{ST2}$" to -- ST2 --.

IN THE CLAIMS

Column 11, line 11, change "$\overline{ST2}$", first occurrence, to -- ST2 --.

Signed and Sealed this

Twenty-eighth Day of February, 1989

Attest:

DONALD J. QUIGG

Attesting Officer     Commissioner of Patents and Trademarks